(12) United States Patent
Brown

(10) Patent No.: US 6,888,679 B2
(45) Date of Patent: May 3, 2005

(54) LASER DIODE BAR INTEGRATOR/ REIMAGER

(75) Inventor: Daniel M. Brown, Madison, AL (US)

(73) Assignee: Mems Optical, Inc., Huntsville, AL (US)

( * ) Notice: Subject to any disclaimer, the term of this patent is extended or adjusted under 35 U.S.C. 154(b) by 0 days.

(21) Appl. No.: 10/716,864

(22) Filed: Nov. 20, 2003

(65) Prior Publication Data

US 2004/0174604 A1 Sep. 9, 2004

Related U.S. Application Data

(60) Provisional application No. 60/427,571, filed on Nov. 20, 2002.

(51) Int. Cl.[7] .................... G02B 27/10; G02B 27/12; G02B 27/14

(52) U.S. Cl. .................. 359/625; 359/636; 359/640

(58) Field of Search ........................... 359/618, 624, 359/625, 636, 640, 641, 668; 362/259; 372/100

(56) References Cited

U.S. PATENT DOCUMENTS

| | | |
|---|---|---|
| 4,890,923 A | 1/1990 | Buschelberger |
| 5,369,661 A | 11/1994 | Yamaguchi et al. |
| 5,513,201 A * | 4/1996 | Yamaguchi et al. .......... 372/75 |
| 6,400,513 B1 | 6/2002 | Southwell |

\* cited by examiner

Primary Examiner—David N. Spector
(74) Attorney, Agent, or Firm—Keady, Olds, Maier & Richardson, PLLC

(57) ABSTRACT

A beam integrator system, which integrates multiple beams into fewer beams of increased intensity by using a combination of optical elements and lenses.

16 Claims, 6 Drawing Sheets

DETECTOR IMAGE: INCOHERENT IRRADIANCE

DETECTOR IMAGE: INCOHERENT IRRADIANCE

DETECTOR IMAGE: INCOHERENT IRRADIANCE

LASER DIODE BAR INTEGRATOR/ REIMAGER

CORRESPONDING APPLICATIONS

This application is a utility application, which is a conversion of provisional No. 60/427,571, filed 20 Nov. 2002, the entire contents of which are incorporated in their entirety.

FIELD OF THE INVENTION

The present invention relates to a method, apparatus and system for combining and integrating the multiple laser beams of a laser diode bar into fewer beam(s).

BACKGROUND OF THE INVENTION

Since the advent of low-cost laser diodes, their inherently low power densities have limited the usefulness of these devices. Various combinations of lenses and other optical devices have been used to combine multiple laser diode beams into fewer beams (e.g., a single beam) to increase power density. More commonly, multiple laser diodes or laser diode bar arrays simply serve as optical pumps for solid state lasers, rather than using their light directly in the laser machining or other high power laser process.

Using the laser diode light directly in laser machining and product marking could increase the efficiency and reduce the cost for such systems, but has proven to be a challenge due to the low average brightness or radiance of diode bar arrays. The low average radiance is due to the geometry of laser diode bars. Since a single emitting junction cannot provide the required high power, a stripe or series of long narrow emitters stacked end-to-end is usually fabricated into a high power laser diode bar. Each individual emitter is approximately 500 microns or more. Thus, although the radiance within each emitter aperture is quite high, the average radiance over the entire length of the stripe is low due to the dead space between the emitters.

A typical laser diode bar consists of a linear array of rectangular emitters, with each emitter having a narrow width about 1 micron and a length of several microns up to more than one hundred microns. Typically, the long dimension of the emitter is coplanar with the long dimension of the array, effectively producing a long thin line source as illustrated in FIG. 1. This is the easiest way to manufacture a high power laser diode bar in a single monolithic substrate. Good collimation of the light from the line source can be achieved in a narrow direction using a simple collimating lens, but not in the long direction. Due to the total length of the source in the long dimension, the collimated beam will have considerable divergence in this direction, as well as multiple dips in the intensity profile due to the non-emitting space between emitters.

In order to reduce this problem, some laser diode array manufacturers solder multiple emitter bars side-by-side in a stack as illustrated in FIG. 2. The amount of dead space is reduced relative to emitted power (although not completely eliminated) and the source size is more compact. Due to the soldering process, the emitter spacing is not nearly as uniform as that of FIG. 1, and thus is not conductive to coupling with microlens arrays for beam integration.

SUMMARY OF THE INVENTION

An exemplary embodiment of the invention provides an optical system for combining multiple laser beams of a laser diode bar array into fewer beams (e.g. a single beam, two beams, . . . ) with greater power density.

A further exemplary embodiment of the invention provides an optical system that optically removes the non-emitting space between the emitters so that the intensity profile of the collimated beam is more uniform.

Other exemplary embodiments of the invention provide a means of optically combining the individual emitters to increase the average radiance using a multi-aperture beam integrator system.

Further exemplary embodiments of the invention provides a lens (e.g. anamorphic lens) or array of lenses (e.g. an array of anamorphic lenses) to reshape an incident laser beam profile(s) in the fast and slow axis directions into desired laser beam profile(s). The invention provides a multi-beam integrator system, which is used along with a means of optically rotating the emitters by an angle (e.g. 90 degrees). The angle rotation allows for better balancing of the optical invariants in the slow and fast axis directions, making it easier to "circularize" the image for coupling into fibers or to increase the irradiance for laser machining applications. Furthermore, the present invention includes a lens (e.g. anamorphic lens) to achieve a nearly circular beam along with providing a significant increase in irradiance.

The invention and the methods derived thereof effectively reduce the source size so that one can achieve greater collimation and energy density.

BRIEF DESCRIPTION OF THE DRAWINGS

Features of the invention can be more fully appreciated through consideration of the detailed description of the invention in conjunction with the several drawings in which.

DETAILED DESCRIPTION OF EXEMPLARY EMBODIMENTS

Exemplary embodiments of the invention can be used to increase the average source radiance and decrease the source size of a laser diode bar, comprised of an array of emitters, by optically reimaging and combining the emitters in such a way as to remove or reduce the non-emitting space between adjacent emitters and by optionally applying nonsymmetric (anamorphic) magnification to the superimposed image.

An exemplary embodiment of the invention, the multiple emitters of a laser diode bar configuration are reimaged and superimposed into a single emitter image with much smaller length so that the irradiance is increased and the image dimensions are more nearly equal in the orthogonal directions. If this image were reimaged to infinity, good collimation could be achieved in both the slow and fast axis directions of the emitter. A device produced in accordance with exemplary embodiments of the invention optically removes the non-emitting space between the emitters so that the intensity profile of the collimated beam is more uniform. The images of all the emitters are optically superimposed, effectively producing a single emitter. Furthermore, the long dimension of the single emitter image can be reduced with a lens (e.g., simple cylindrical lens, anamorphic lens, . . . ) so that the numerical apertures (NAs) of the emitter image are nearly identical in both orthogonal directions.

Although this invention applies to and illustrates focused beams (see FIG. 3), the same advantages also apply to collimated beams with the emitter imaged to infinity. Applications for focused beams include laser welding, marking, and materials processing. A smaller, more uniform source is more useful to these applications. Collimated beam applications include targeting and illumination of distant objects.

For the purposes of describing the present invention, a typical high power laser diode bar in linear configuration, comprising of an array of 11 emitters on a 708-micron pitch, with each emitter having dimensions of 1 micron by 100 microns, will be described in this disclosure. The wavelength is 980 nm and the beam divergences in the slow and fast axis directions are 10 deg and 28 deg FWHM respectively. Each emitter produces 1 W of power. However, it is clear that this invention can be used with numerous other laser diode bars with different parameters (e.g. the laser diodes can have different dimensions, pitches, and wavelengths). With the above described laser diode bar, 608 microns of space between emitters is non-radiant or non-emitting. It is desired to remove this non-radiant space and superimpose all emitters into real or virtual image of a single uniform emitter.

Figure 1:
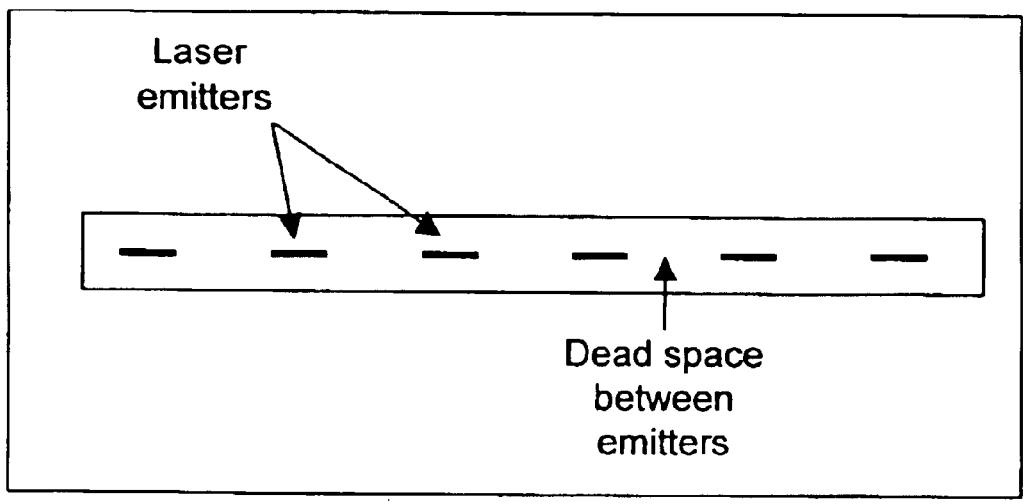
FIG. 1 illustrates a conventional diode bar consisting of multiple emitters stacked end-to-end in a linear array, with non-emitting space between each emitter.
Figure 2:
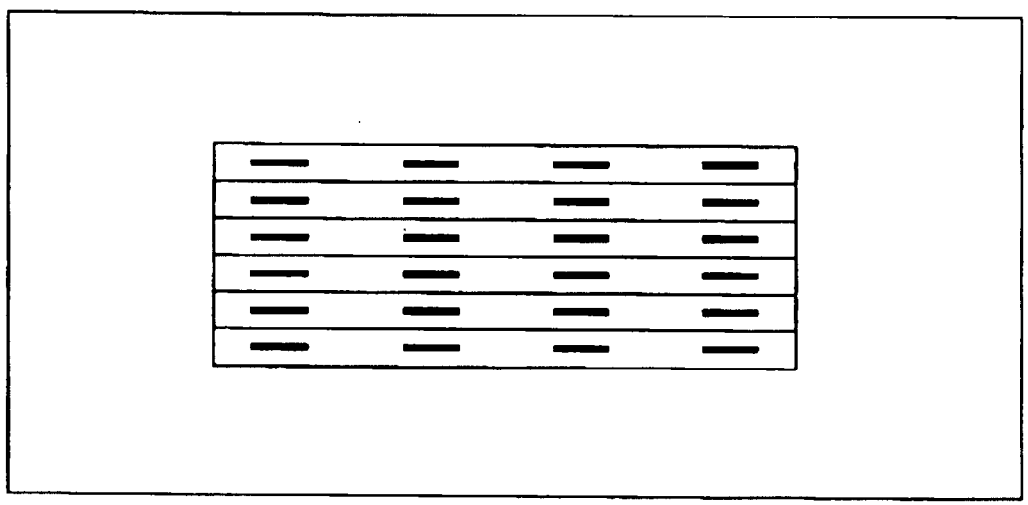
FIG. 2 illustrates another conventional stacking of the emitters side-by-side in a more compact array.
Figure 3:
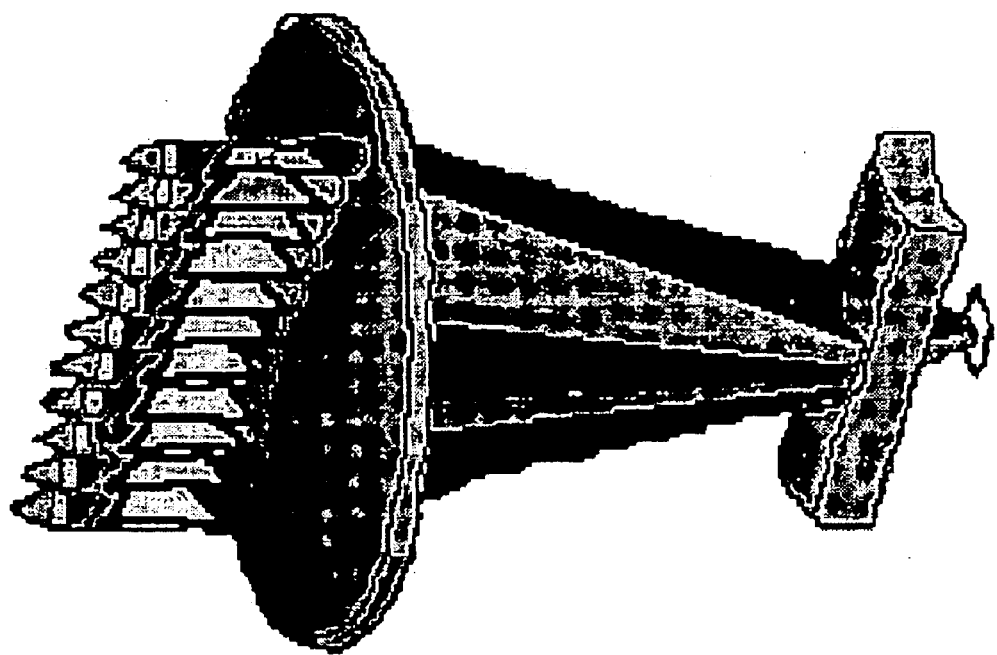
FIG. 3 illustrates an exemplary embodiment of the invention showing the microlens array and mirror array rotating the images of the emitters by 90 degrees, the integrator lens superimposing all eleven (11) far-field images of the emitters, and an anamorphic lens circularizing the combined emitter image on the image plane, where the source emitters are stacked end on end in the y-direction and imaged to a single bar oriented in the x-direction.
Figure 5:
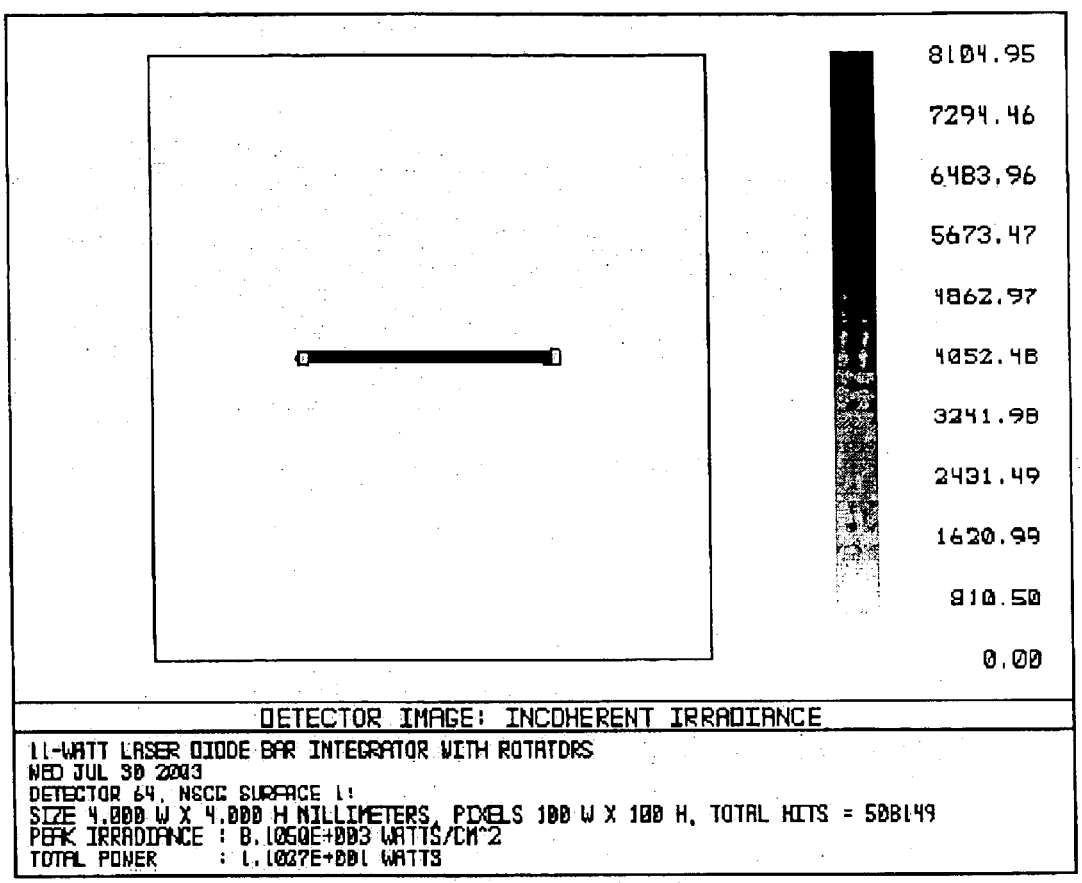
FIG. 5 shows the image plane irradiance (image of superimposed emitters) without the anamorphic lens. Emitter image is rotated 90 degrees with respect to source emitter.
Figure 6:
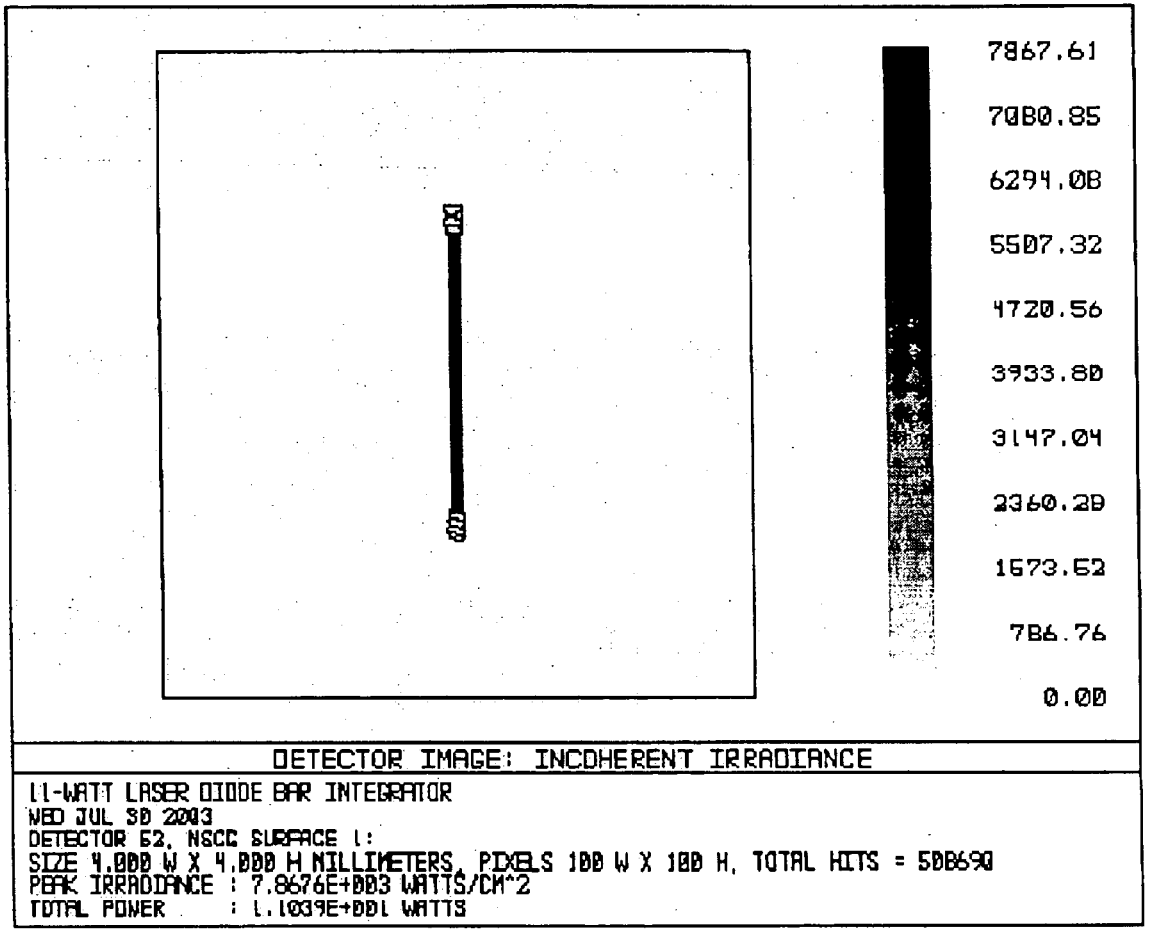
FIG. 6 shows the image plane irradiance (image of superimposed emitters) with the dove prism array or image rotator device removed, where the image is oriented in same direction as source emitter.
Figure 7:
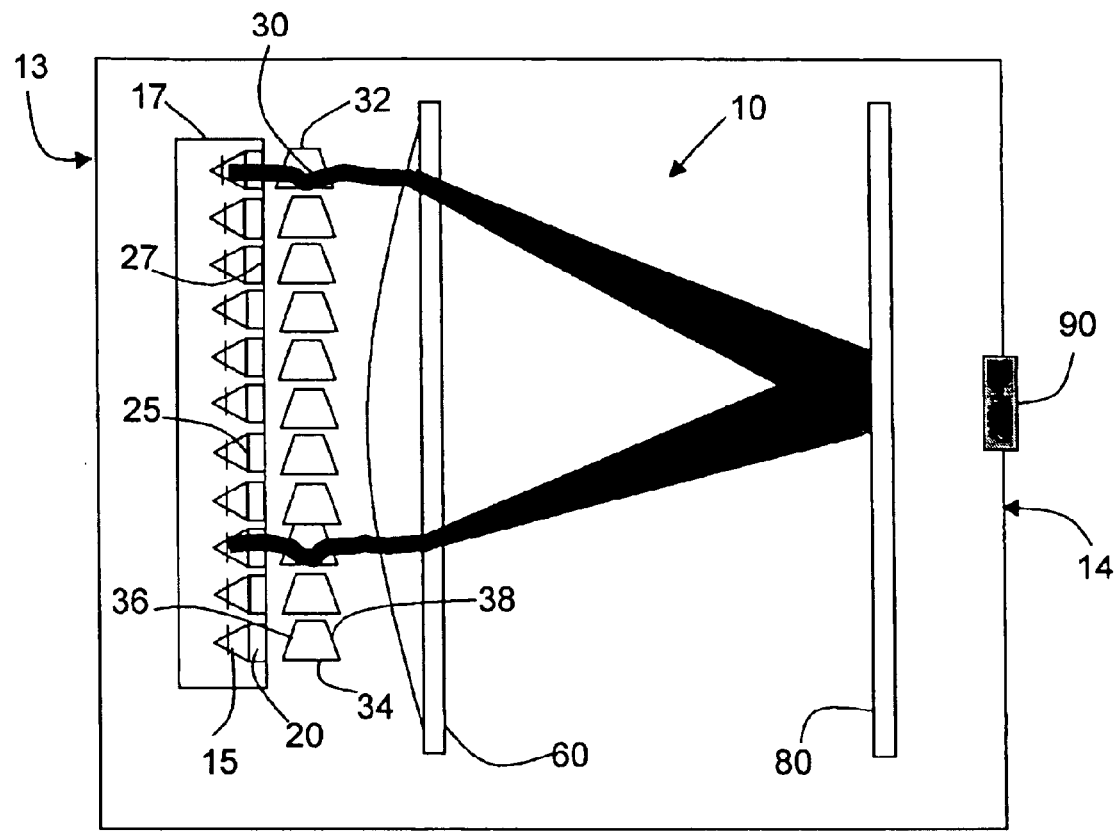
FIG. 7 illustrates a cross-sectional view of the system of FIG. 3, according to an exemplary embodiment of the invention.
Figure 8:
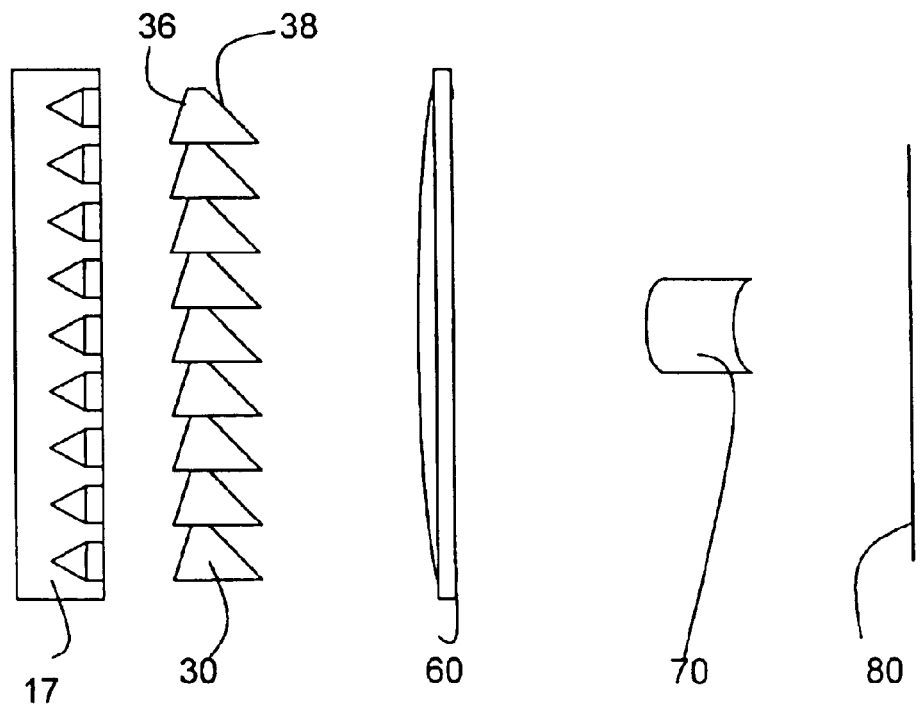
FIG. 8 illustrates a cross-sectional view of a system in accordance with an exemplary embodiment of the invention wherein an optical array can be a prism array where the prism array element is non symmetric, or the optical array is a diffractive array.

Examples according to exemplary embodiments of the invention are illustrated in FIGS. 3, 7, and 8. In one exemplary embodiment of the invention, due to its ease of fabrication, separates the microlens array from the image rotator array. (It is clear that these elements could be combined into a single monolithic element.) The image rotator array described here consists of an optical array ( e.g., an array of micro-dove prisms). Each optical array element (e.g. prism) consists of refractive wedges on each side of the array with a reflective mirror between the wedges. The dove prism array may be fabricated by polishing the edges of strips of glass plates to the proper wedge angle, then coating one side of each glass plate with silicon, and then anodically bonding the strips into a stack. The wedge can be non-symmetric. Alternatively, the plates can be optically cemented. In order to combine the microlens array and dove prism array into one element, the wedge or tilt would be fabricated into the microlens surface profile FIGS. 3 and 7 show a ray trace of an embodiment of the present invention with the emitter array source 17 on the left side of the figures and the superimposed image 90 on the right. The emitters 15 are stacked end-to-end in the vertical or y-direction, with the fast axis divergence in the x-direction. A magnified image of the emitter, is formed on the image plane. All the individual images of the emitters are superimposed on the image plane forming a single magnified bar image of the emitter, as illustrated in FIGS. 4, 5, and 6.

Figure 4:
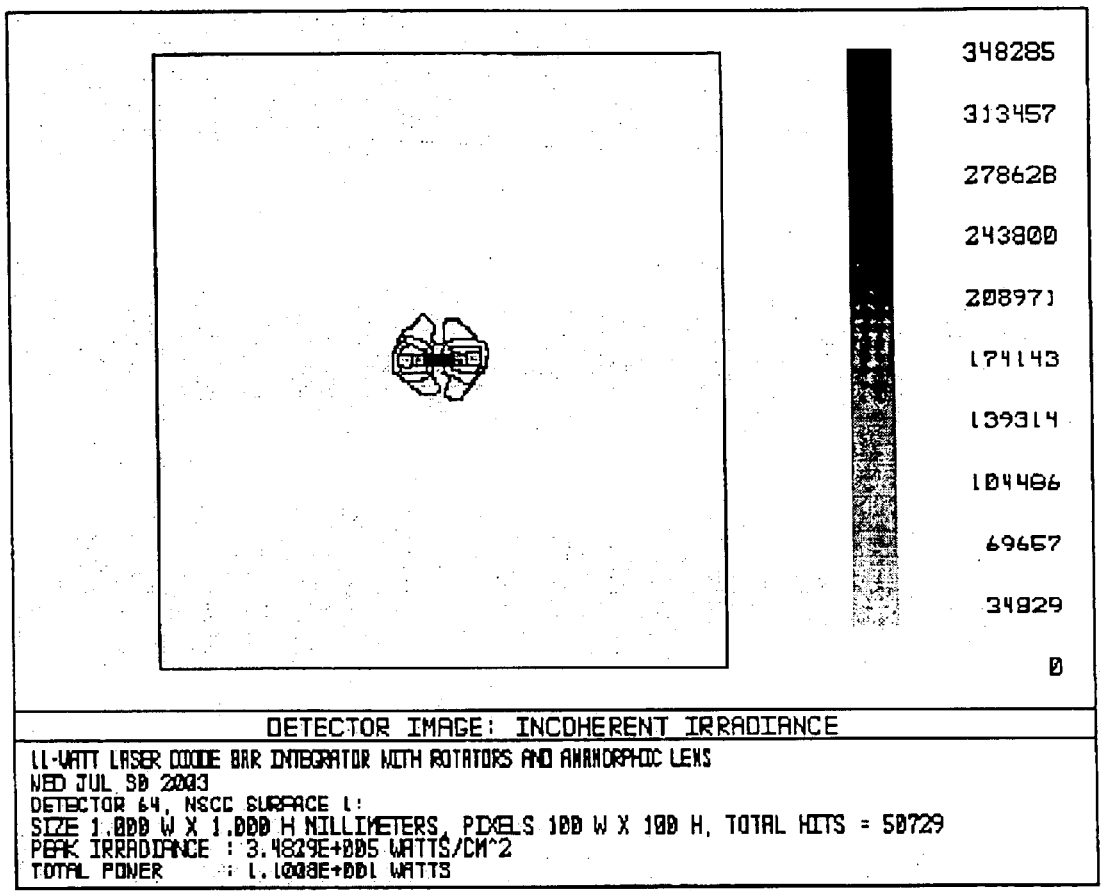
FIG. 4 shows the image of the superimposed emitters produced at the image plane of the embodiment in FIG. 3, where the length of a bar image is shorter than original laser diode bar due to the anamorphic lens, which also increases the irradiance of the image.

FIG. 4 shows the image with the anamorphic lens included to reduce the image size. FIGS. 5 and 6 show the image irradiance without the anamorphic lens. The image is proportional in shape to source emitter. FIG. 5 includes the dove prism array showing rotation of the image by 90 degrees; FIG. 6 results when the dove prism array is removed. Light emitted from the laser diode bar is first collimated by the microlens array into eleven collimated beamlets. Each beamlet is directed onto the angled face of a micro-dove prism. The tilted face refracts the beamlet toward the reflective face of the dove prism, which then reflects the beamlet toward the second face of the dove prism. The second angled face bends the collimated beam back into the original direction of travel from the microlens. The mirror face is parallel to the optical axis (z-axis) but angled by 45 degrees in the x-y plane. The integrator lens 60 combines all eleven beamlets (e.g. a beam combining lens) to a single image of the emitter at image plane 80.

FIG. 7 illustrates a beam integrator system 10 according to an exemplary embodiment according to the invention. The laser diode bar 17 includes a plurality of emitters 15 which are located in an end-to-end position with respect to the neighboring emitter. In the exemplary embodiment each individual emitter 15 aperture can be of variable size (e.g. 1 micron wide by 100 microns). The spacing between emitters 15 can vary (e.g 400 microns).

Each of the emitters 15 can have a corresponding micro-lens 20 so as to collimate the light being emitted from the emitters 15. Alternative embodiments do not have a corresponding micro-lens 20, instead the optical array 30 can be designed to collimate the laser diode light. Each micro-lens 20 has a first side 25 and a second side 27, wherein the first side 25 and second side 27 generally opposite to one another. The emitters 15 are located on the first side 25 of the micro-lens 20 and a corresponding dove micro-prism 30 is located on the second side 27 of each micro-lens 20. As shown in FIG. 7, the optical elements 30 (e.g. dove micro-prisms) are stacked top to bottom upon one another. In alternative embodiments the micro-prisms can be staggered (not shown).

In an exemplary embodiment the optical element is a dove micro-prism 30 have a general three dimensional trapezoidal shape having a top side 32 and bottom side 34 and two sloped sides 36, 38. The top side 32 of each dove micro-prism 30 can be connected to the bottom side 34 of the neighboring dove micro-prism 30 to form the stacked array as shown in FIG. 7. Alternatively there can be a spacing between optical elements 30. Furthermore, each of the corresponding emitters 15, micro-lens 20 and dove micro-prisms 30 all share an axis. The array of dove micro-prisms 30 can optically rotate the individual emitter images by a chosen angle (e.g. 90 degrees). Such rotation can be used in conjunction with a lens to reduce the long dimension of the long dimension of the emitter image (e.g. a rotation of 90 degrees allows an anamorphic lens (discussed later) to easily reduce the long dimension of the emitter image).

The beam integrator system 10 also includes an integrator lens 60. In the exemplary embodiment, the diameter of the integrator lens 60 can be greater than or equal to the height of the stacked dove micro-prisms 30. In the exemplary embodiment the integrator lens is comprised of a normal plano-convex lens. However, this could be a bi-convex lens, a meniscus lens, or combination of elements to minimize aberrations. The specific shape or number of elements is not germane to the invention, only that it has positive optical power and combines the beams in an aberration-free manner. The integrator lens 60 combines the light beams exiting emitters and overlap the real images of the emitters at the focal point of the integrator lens.

FIG. 8 illustrates an exemplary embodiment of the invention having an anamorphic lens 70 and a asymmetric optical array 30.

Once the beams of light exit the integrator lens 60, the beams of light can be passed through an anamorphic lens— to reduce the long dimension of the emitter image. In exemplary embodiments of the present invention spots or linear images formed in the image plane 80 can have sizes between 1–1000 microns, with peek power densities from 10–1000 kW/cm2. Other exemplary embodiments have various peek powers and sizes and the discussion herein should not be interpreted to limit the image formed on the image plane, for example the image can be a few microns in width and millimeters in length having a peek power of hundreds of kW/cm2.

Variations in the shape and type of optical arrays are intended to fall within the scope of the invention. For example the optical array can be a diffractive array as opposed to the refractive array.

What is claimed is:

1. A beam integrator comprising:
  a laser diode array, where the diode array contains a plurality of emitters; and
  an optical array, where the optical array comprises a plurality of optical array elements, each optical array element associated with an emitter, where each emitter emits an associated beam, a plurality of beams comprised of a plurality of associated beams, where the optical array integrates the plurality of beams into fewer beams of increased relative intensity.

2. The beam integrator of claim 1, wherein at least one of the plurality of optical array elements is an asymmetric prism.

3. The beam integrator of claim 1, wherein at least one of the plurality of optical array elements is a dove prism.

4. The beam integrator according to claim 3, further comprising:
  a beam combining lens.

5. The beam integrator according to claim 4, further comprising:
  an anamorphic lens, which further integrates the fewer beams.

6. The beam integrator according to claim 3, wherein the dove prisms are arranged linearly.

7. The beam integrator according to claim 3, wherein the dove prism has a general trapezoidal shape.

8. The beam integrator according to claim 1, wherein at least one of the optical array elements has positive optical power.

9. The beam integrator according to claim 4, wherein the beam combining lens has a height which is equal to or greater than the height of the optical array.

10. A beam integrator system comprising:
  a laser diode array comprising, a plurality of emitters which are positioned in an end-to-end position with respect to one another, where each emitter has an emitter height;
  a plurality of microlens, wherein each microlens is attached and aligned with one of the plurality of emitters, where each microlens has a microlens height, where the microlens height is less than the accumulated plurality of emitters heights;
  a plurality of dove prisms which are positioned in an array and wherein each of the dove prisms are respectively aligned with the one of the plurality of emitters and at least one of the plurality of microlens; and
  a beam combining lens.

11. A method of integrating a plurality of beams to form a beam with a near circular cross-section, comprising:
  rotating beams by an angle to obtain associated rotated beams, wherein the beams are generated by a plurality of emitters, and where the rotating step is performed by an array of optical elements;
  combining the associated rotated beams by passing the associated rotated beams through a positive lens to form at least one combined beam; and
  varying the cross section of the combined beam, by passing the at least one combined beam through an anamorphic lens.

12. The method according to claim 11, wherein a least one of the optical elements is a dove micro-prism.

13. An optical device emitting coherent energy in a single collimated beam comprising:
  an array of laser emitters arranged with a regular and predetermined pattern and spacing;
  a microlens array having:
    a plurality of incident microlens each microlens corresponding to at least one of the laser emitters and collectively having a pattern and spacing complementary to the predetermined pattern and spacing of the laser emitters for focusing the energy emitter from said laser emitters; and
    additional optical elements collimating the energy emitted by said laser emitters and focused by said incident micro-lens to produce a collimated and phase coherent combination of the outputs of each of said laser emitters to decrease the size of and increase the concentration of the emitted coherent energy.

14. The optical device of claim 13, wherein each said additional optical elements has a focal point which is dependent on its position within said microlens array to focus the energy incident thereon on a single focal point.

15. The optical device of claim 14, wherein each of said additional optical elements correspond to an associated laser emitter and incident microlens.

16. The optical device of claim 13, wherein each said additional optical elements has a focal point which is dependent on its position within said microlens array to focus the energy incident thereon; said optical device further comprising an integrator lens receiving the output of said micro-lens array on a single focal point.

* * * * *